United States Patent [19]

Coleman et al.

[11] 4,045,245
[45] Aug. 30, 1977

[54] SOLAR CELL PACKAGE

[75] Inventors: Michael G. Coleman, Tempe; Robert A. Pryor, Phoenix, both of Ariz.

[73] Assignee: Motorola, Inc., Schaumburg, Ill.

[21] Appl. No.: 646,733

[22] Filed: Jan. 5, 1976

[51] Int. Cl.[2] .......................................... H01L 31/06
[52] U.S. Cl. .................................. 136/89 C; 29/572
[58] Field of Search .......................................... 136/89

[56] References Cited

U.S. PATENT DOCUMENTS

| 3,268,336 | 8/1966 | Guyot | 136/89 |
|---|---|---|---|
| 3,466,198 | 9/1969 | Webb | 136/89 |
| 3,562,020 | 2/1971 | Blevins | 136/89 |

Primary Examiner—John H. Mack
Assistant Examiner—Aaron Weisstuch
Attorney, Agent, or Firm—Charles R. Hoffman

[57] ABSTRACT

A solar cell package includes a plurality of solar cells within a space formed by a support member and a transparent cover member. A first conductor is positioned between the support member and the solar cells and makes electrical contact to a first surface of each of the solar cells. A second conductor is essentially coplanar with the first conductor and makes electrical contacts to a second surface of each of the solar cells. The output terminals of the solar cell package are connected to the first and second conductors. The first and second conductors are electrically isolated from each other and are also insulated from the support member and from the solar cells insulative means which is electrically insulated but thermally conductive to facilitate dissipation of thermal power dissipated in the solar cells.

16 Claims, 3 Drawing Figures

SOLAR CELL PACKAGE

BACKGROUND OF THE INVENTION

1. Field of the Invention

The invention relates to solar cells for converting solar energy into usable electrical energy, and more particularly, to packages for reliably housing a plurality of solar cells.

2. Brief Description of the Prior Art:

Various types of solar cells are known in the art. For example, silicon solar cells may be provided on silicon wafers having a large-area PN junction. During bright sun light, a 3-inch diameter silicon solar cell may provide about 1.0–1.5 amps of current at approximately 0.5 volts. In order to provide a suitably sized solar panel, a plurality of such solar cells must be housed within a single package. It is necessary that the electrodes of each silicon solar cell make low resistance electrical contact to the P-region and N-region forming the large area PN junction. It is also necessary that the means of electrically contacting the semiconductor material upon which the incident solar radiation falls be such that semiconductor active area is shielded as little as possible by the contacting material. To date, no solar package for solar cells has been provided which provides the combined features of minimizing shading of solar radiation from the cells, and provides high packing density of the solar cells such that each solar cell is very closely located to the adjacent solar cells, and which is easily manufacturable and which provides a satisfactorily low amount of resistance between the terminals of each individual solar cell and the external terminals of the solar cell package.

SUMMARY OF THE INVENTION

It is an object of the invention to provide a solar cell package which maximizes active solar cell are exposed to solar radiation and which has a minimum amount of internal resistance to the active regions of the solar cell from the external terminals of the solar cell package.

It is another object of the invention to provide a solar cell package wherein conducting members coupled to the external terminal of the solar cell package are located on the opposite side of the solar cells from which solar radiation is received.

It is another object of the invention to provide a readily manufacturable solar cell package.

Briefly described, the invention is a solar cell package including a back member and a transparent cover plate member forming and enclosing a substantially filled region. A plurality of solar cells are located within the region, each of the solar cells having a first surface adjacent to the cover plate member and a second surface adjacent to the back member. All of the power conductors coupled to the external terminals of the solar cell package are located on the sides of the solar cells opposite to the cover plate member. Electrically insulative and termally conductive material is located between the power conductors and the solar cells and also between the power conductors and the back member. In one embodiment, the back member itself is connected to one side of each solar cell and serves as a power conductor.

DESCRIPTION OF THE INVENTION

Figure 1:
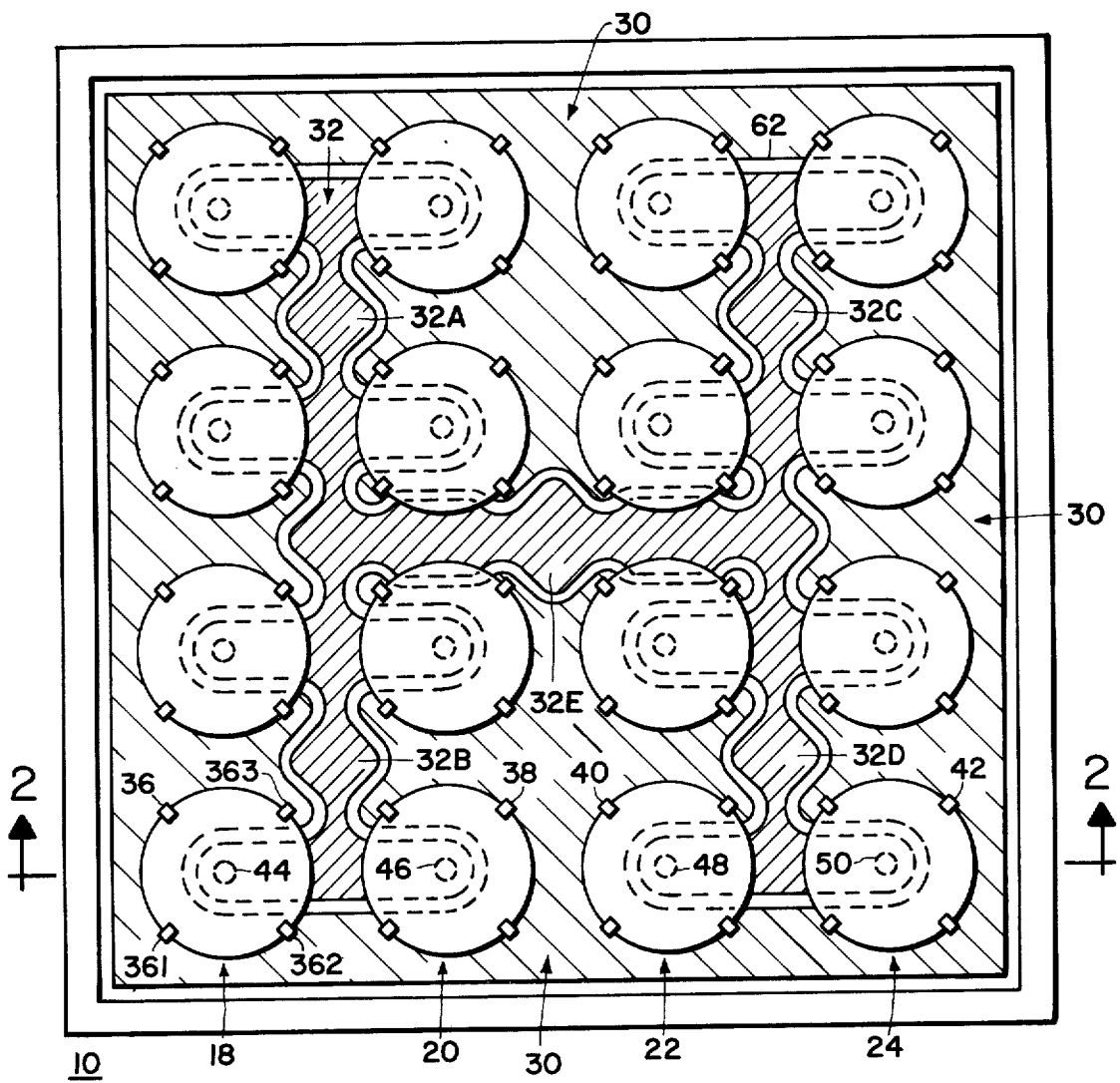
FIG. 1 is a top view diagram of an embodiment of the invention.
Figure 2:
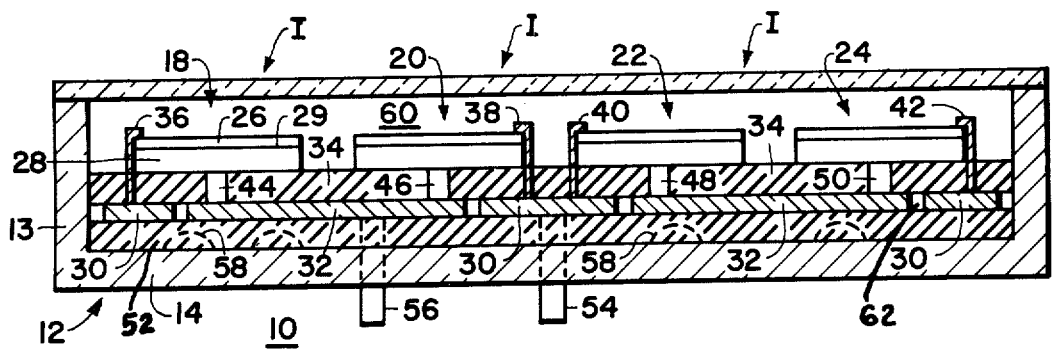
FIG. 2 is a side view diagram through line 2—2 of the embodiment of the invention shown in FIG. 1.

A presently preferred embodiment of the invention is described by reference to FIGS. 1 and 2. Solar package 10 includes back member 12, which is essentially a shallow pan having a bottom 14 and sides 13. It should be noted that the dimensions in FIGS. 1 and 2 are not drawn to scale. The inner surface of bottom 14 of back member 12 may include ridges 58 to provide structural strength. Back member 12 may be made of a metal such as aluminum or other substance which may not be metallic. Cover plate 16 is transparent to incident radiation which is converted to electrical energy by the solar cells. Cover plate 16 may advantageously be an anti-reflection treated glass material. A plurality of solar cells such as 18, 20, 22 and 24 are included within cavity 16 sealed off by cover plate 16 and back member 12. Although various types of solar cells may be suitably packaged in solar cell package 10, semiconductor solar cells are referred to hereinafter. Each solar cell includes a wafer having a body region of one conductivity type and a second region of the opposite conductivity type forming a large area junction therebetween. For example, solar cell 18 includes P-type substrate region 28 and N-type region 26 forming PN junction 29.

Each of the solar cell wafers, may, for example, be three inches in diameter. The doping level of the N-type region 26 may be close to solid solubility levels at the top surface of the wafer, and the doping level of the P-type region may be, for example, in the range from 10 ohm centimeters to 0.1 ohm centimeters. This range of doping levels however, is not at all inclusive. When incident sunlight, indicated by the arrows I in FIG. 2 falls on solar cell package 10, it passes through cover plate 16 and strikes the exposed surface of each of the solar cells. This causes a substantial amount of current to flow across the PN junctions, such as junction 29. A metallized pattern is provided on the upper surface of each of the wafers electrically contacting N-type region 26. The metallized pattern, of course, shields active semiconductor surface area from the incident sunlight, and decreases the efficiency of the energy conversion process. Therefore, it is highly desirable that the metallization pattern utilize the narrowest conductor possible while nevertheless having the lowest resistance so as to decrease power dissipation and minimize the voltage drop due to high current flowing in the metallization from the various portions of the semiconductor wafer. The opposite surface of each wafer, i.e., the bottom surface of each wafer in FIG. 2, is coated with an electrically conductive layer which extends over the entire bottom surface so that current flowing into P-type substrate region 28 is distributed through very low resistance to all portions of P-type region 28. (Of course, the bottom conductive layer may be suitably patterned). Thus, the solar cell metallization is selected such that the voltage drop at each solar cell is minimized. The metallization on the top surface of each of the solar cells is connected to a first conductor 30 located beneath all of the solar cells, and isolated therefrom by a thermally conductive electrically insulative material 34, which may for example, be an alumina filled silicone. For example, a metallized surface of solar cell 18 is connected to conductor 30 by means of conductor 36. Conductor 36 may be a wire or a strap which is electrically attached to conductor 30 and the metallized surface of solar cell 18. Or, it may more preferably be a punched out tab portion of conductor 30 which is bent upward and soldered or otherwise attached to the metallized upper surface of solar cell 18. Similarly, conductor tabs 38, 40 and 42 couple the upper metallized surfaces of solar cells 20, 22 and 24, respectively, to conductor 30.

Conductor 30 is electrically connected to terminal 54, which may end through the bottom of solar package 12, as shown in FIG. 2 or may even extend to the side or even to or through the cover plate in any suitable manner. The second thermally conductive but electrically insulative layer 52 is located between conductor 30 and support member 12. A second conductive layer 32 is substantially coplanar with conductor 30 is sandwiched between insulators 34 and 52. As shown in FIG. 1, conductive layer 32 has the general appearance of an H which has been separated from conductor 30 by removal of conductor material forming a gap 62 between conductors 30 and 32, so that they nowhere electrically contact each other. The metallized lower surfaces of solar cells 18, 20, 22 and 24 electrically contact conductor 32 by means of members 44, 46, 48 and 50, respectively. The contact members such as members 44 may advantageously be dimples or punched out tab portions of conductor 32 which extend through accommodating openings in insulative layer 34 in the same manner that conductive members or tabs 36 contacts the upper metallized surfaces through accommodating apertures in insulator material 34. Alternatively, all of the area of the subtended conductor lying directly beneath said solar cell may be contacted by the metal of that solar cell. Conductor 32 is connected to external terminal 56 which extends through the backside of back member 12 in the same manner as terminal 54. Of course, terminals 54 and 56 are electrically insulated by appropriate grommets of washers from back member 12 if back member 12 is an electrically conductive material.

Referring to FIG. 1, it is seen that solar package 10 includes 16 solar cells, each having its lower metallized surface electrically contacting each sheet conductor 32. For example, wafer 18 has its bottom metallized layer contacting conductor 32 by means of contact member 44 extending through an aperture in insulator 34, as explained above. The upper metallized pattern on solar cell 18 contacts conductor 30 by means of four tabs 36, 361, 362 and 363. For convenience, the metallized pattern is not shown in FIG. 1. However, in order to minimize both the resistance of the metallization and the amount of active surface area of solar cell 18 that it covers, it is highly advantageous to provide electrical contact at at least four places around its perimeter. Of course, if it were necessary, additional contact members or tabs such as 36, etc., could be provided. It will be noted that the side view shown in FIG. 2 does not correspond exactly to the top view in order to clarify the explanation of a structure. For example, contact member 36 as shown in FIG. 1 does not really appear across section line 2—2, but is nevertheless shown in FIG. 2 for clarification. For simplicity, the other contact members 361, 362 and 363 have been omitted. The same holds true for the remaining solar cells shown in FIG. 2.

By referring to FIG. 1, it is seen tht the "H-shaped" structure of conductor 32 and the complementary structure of conductor 30 permit contacts to the heavily metallized low resistance back surfaces of each of the solar cells to a single conductor 32, and permit four peripheral contact points of each of the partially metallized upper solar cell surfaces to conductor 30. A parallel electrical connection of all 16 solar cells between terminals 54 and 56 is thus achieved. Of course, the number of rows and columns could be diminished or expanded in either direction in FIG. 1, an additional cross region such as 32 could be provided as a number of rows is increased, and additional members such as 62 could be added as additional columns of solar cells are added. It should be emphasized that the conductor topography can be chosen such that the shapes of conductors 30 and 32 may accommodate more or less the four front surface contact points between conductor 30 and each solar cell.

Figure 3:
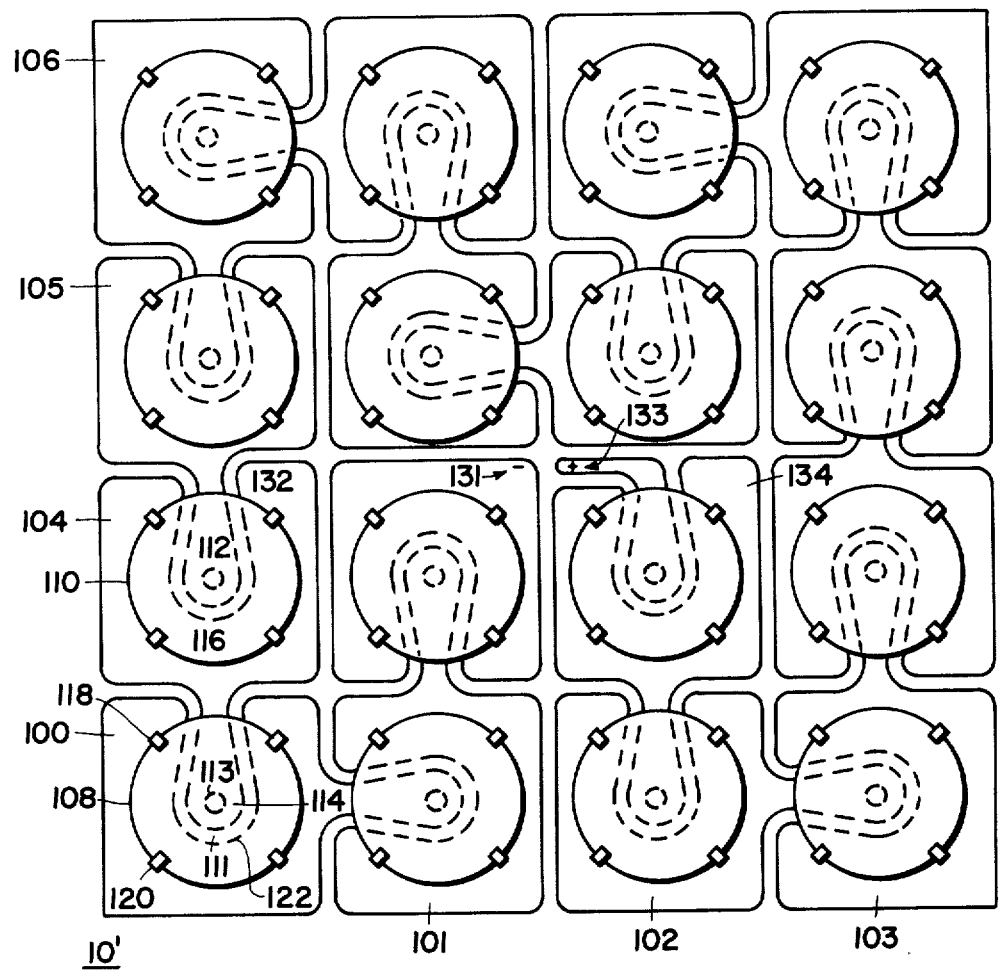
FIG. 3 is a top view diagram of another embodiment of the invention.

FIG. 3 is a partial top view diagram showing an alternate method of connecting solar cells in series rather than in parallel. The structural features of packaging series connected solar cells are similar to the features shown in FIGS. 1 and 2, except that the conductor shapes are different as shown in FIG. 3. In FIG. 3 it is seen that the lower metallized surface of each solar cell, such as solar cell 108 is connected to a tab like portion of such as 114 of a metal conductor such 104. The upper metallized pattern of each solar cell is connected by means of four symmetrically positioned contact members 118, 120, etc., to a second conductor 100 which is separate and spaced from the first conductor 104 and separated therefrom by means of a narrow space 111. Of course, the topograph of conductor 100 also could be chosen to accommodate more or less than four front surface contact points. There are 16 such conductors, each of which has a tablike protrusion such as 114 and also has an open region such as 122 which essentially accommodates the tablike protrusion of another of the conductors. As in FIG. 2, all of the conductors are essentially coplanar and are sandwiched between insulators 34 and 52. The conductive members extend through openings in such insulator as 34 as shown in FIG. 2. However, only the "end" conductors in FIG. 3 forming the two ends of the "chain" formed by the "tongue-in-groove" arrangement of the conductors in FIG. 3 are connected to external terminals 54 and 56. For example, portion 131 of conductor 132 could be connected to external terminal 54 and a tongue-like conductor 133 fitting in a groove portion of conductor 134 could be connected to the other external terminal 56 of a package similar to that in FIG. 2.

Referring to FIG. 2, the remaining part of space 60 could be filled with a transparent filler, which could be some sort of silicone material.

It should also be recognized that various series-parallel combinations of solar cells could be provided within a single package such as 10, to provide both stepped up voltages characteristic of the series connected solar cells and high current capability and inherent reliability of the parallel connected solar cells.

The package as described in FIGS. 1-3 provides a readily manufacturable package for solar cells which has a number of important advantages. The conductive sheets can all be punches out of the same piece of foillike material, so that very little material is wasted. Positioning of the power conducting busses beneath the solar cells eliminates any shading of the active exposed surface of the solar cells that would occur if one of the power conductors were above the solar cells. The general shape of the support member 12 is relatively rigid, which is important, since the solar cell wafers may only be from 10 to 20 mils in thickness, and consequently, the vertical dimension of the package may be rather small. The insulative and conductive elements of the package are all easily formed of relatively inexpensive materials and the elements are easily assembled.

Of course, the structure of the solar cell package is not dependent on the slope of the solar cells, i.e., they may be in the form of square or rectangular or otherwise sloped wafers as well as round wafers.

Also, it should be noted that the contacts of the power conductors to the P- and N-regions of each solar cell need not be on opposite sides of the wafer. For example, the solar cell could be provided with wrap-around metal contact conductors extending around the edge of the wafer from the top surface to the back surface of the wafer, where contact to the power conductors could be made. Or, heavily doped diffused regions of the same conductivity type as the top surface could extend through to the back of the wafer, where they could contact patterned metallization which in turn could contact an appropriate power conductor.

What is claimed is:
1. A solar cell package comprising:
a back member;
transparent cover plate means said back member and said cover plate means being adapted for enclosing a space bounded by said back member and said cover plate means;
a plurality of solar cells, each having a first and a second surface thereof, located within said space;
first conductor means located between said solar cells and said back member and coupled to said first surface of each of said solar cells for electrically contacting said first surface of each of said solar cells;
second conductor means located between said solar cells and said back member coupled to said second surface of each of said solar cells for electrically contacting said second surface of each of said solar cells;
insulating means located between said back member and said first and second conductor means and also located between said first and second conductor means and said solar cells for preventing portions of said first and second conductor means from contacting or touching portions of said solar cells and for preventing portions of said first and second conductor means from contacting or touching portions of said back member.
2. The solar cell package as recited in claim 1 wherein said solar cells are semiconductor solar cells including wafers having a PN junction therein, said first surface having a plurality of thin spaced metallization strips thereon for contacting one side of said PN junction and said second surface being metallized for contacting the other side of said PN junction.
3. A solar cell package as recited in claim 1 further including a plurality of contact members coupling said second conductor means to said second surface of each of said solar cells.
4. A solar cell package as reecited in claim 1 further including a plurality of contact members coupling a metallization on said first surface of each of said solar cells to said first conductor means, said contact members extending through apertures in said insulting means.
5. A solar cell package as recited in claim 1 wherein said insulating means includes a first insulating layer located between said second surface of said cells and said first and second conductor means having openings therein for allowing contact members coupling said first surface of each of said solar cells to said first conductor means and for accommmodating contact members coupling said second surface of said solar cells to said second conductor means.
6. A solar cell package as recited in claim 1 wherein said first conductor means is connected to a first external terminal of said solar cell and said second conductor means is connected to a second external terminal of said solar cell package.
7. A solar cell package as recited in claim 1 wherein said first and second conductor means form a substantially complementary pattern, each conductor being spaced from the other.
8. A solar cell package as recited in claim 1 wherein said back member is in the form of a substantially rectangular pan and said cover plate means is substantially flat and is attached the edges of said back member.
9. The solar cell package as recited in claim 8 wherein a portion of said second conductor means is substantially H-shaped.
10. A solar cell package as recited in claim 1 wherein said contact members contacting said first surface are portions of said first conductor means and said contact meember contacting said second surfaces of portions of said second conductor means.
11. A solar cell package comprising:
a back member;
cover plate means, said back member and said cover plate means being adapted for enclosing a space bounded by said back member and said cover plate means, said cover plate means being transparent;
a plurality of solar cells, each having a first surface and a second surface thereof located within said space;
conductor means located between said solar cells and said back member coupled to said first surface of said solar cells for electrically contacting said first surface of each of said solar cells;
insulating means located between said back member and said conductor means and also located between said conductor means and said solar cells for preventing portions of said conductor means from contacting or touching portions of said solar cells and for preventing portions of said conductor means from contacting or touching portions of said back member;
said back member being conductive and being coupled to said second surface of each of said solar cells, respectively, for electrically contacting said second surface of each of said solar cells.
12. A solar cell package comprising:
a back member;
transparent cover plate means said back member and said cover plate means being adapted for enclosing a space bounded by said back member and said cover plate means;
a plurality of solar cells, each having first and second electrical terminals thereof, located within said space;
first conductor means located between said solar cells and said back member and coupled to said first electrical terminal of each of said solar cells for electrically contacting said first electrical terminal of each of said solar cells;

second conductor means located between said solar cells and said back member coupled to said second electrical terminal of each of said solar cells, respectively, for electrically contacting said second electrical terminal of each of said solar cells;

insulating means located between said back member and said first and second conductor means and also located between said first and second conductor means and said solar cells for preventing portions of said first and second conductor means from contacting or touching of said solar cells and for preventing portions of said first and second conductor means from contacting or touching portions of said back member.

13. The solar cell package as recited in claim 12 wherein said solar cells are semiconductor solar cells including wafers each having a PN junction therein, one side of said PN junction contacting said first terminal and the other side of said PN junction contacting said second terminal of each solar cell.

14. A solar cell package as recited in claim 12 further including a plurality of contact members coupling said second conductor means to said second terminal of each of said solar cells.

15. A solar cell package as recited in claim 12 further including a plurality of contact members coupling a metallization of said terminal of each of said solar cells to said first conductor means, said contact members extending through apertures in said insulating means.

16. A solar cell package as recited in claim 12 wherein said insulating means includes a first insulating layer located between said solar cells and said first and second conductor means having openings therein for allowing contact members coupling said first terminal of each of said solar cells to said first conductor means and for accommodating contact members coupling said second terminal of said solar cells to said second conductor means.

* * * * *